(12) United States Patent
Saitoh et al.

(10) Patent No.: US 11,709,391 B2
(45) Date of Patent: Jul. 25, 2023

(54) DISPLAY DEVICE

(71) Applicant: Japan Display Inc., Tokyo (JP)

(72) Inventors: Akihiko Saitoh, Tokyo (JP); Masateru Morimoto, Tokyo (JP); Hiroyuki Abe, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/851,117

(22) Filed: Jun. 28, 2022

(65) Prior Publication Data

US 2022/0413335 A1 Dec. 29, 2022

(30) Foreign Application Priority Data

Jun. 29, 2021 (JP) ................................ 2021-107448

(51) Int. Cl.

| | |
|---|---|
| *G02F 1/1335* | (2006.01) |
| *G02F 1/1333* | (2006.01) |
| *G02F 1/1343* | (2006.01) |
| *H01L 27/146* | (2006.01) |
| *G02F 1/133* | (2006.01) |
| *G06V 40/13* | (2022.01) |
| *G06V 40/12* | (2022.01) |

(52) U.S. Cl.
CPC .... *G02F 1/133512* (2013.01); *G02F 1/13312* (2021.01); *G02F 1/13338* (2013.01); *G02F 1/13439* (2013.01); *G02F 1/134345* (2021.01); *H01L 27/14623* (2013.01); *H01L 27/14678* (2013.01); *G02F 2201/52* (2013.01); *G02F 2203/01* (2013.01); *G06V 40/12* (2022.01); *G06V 40/1318* (2022.01)

(58) Field of Classification Search
CPC .......... G02F 1/13312; G02F 1/133512; G02F 1/136902; G02F 1/13338; G06V 40/12; G06V 40/13
See application file for complete search history.

(56) References Cited

U.S. PATENT DOCUMENTS

| | | | |
|---|---|---|---|
| 10,914,977 B1* | 2/2021 | Hsu ...................... | G02F 1/13338 |
| 2017/0187934 A1* | 6/2017 | Kwak ................... | G02F 1/1333 |
| 2018/0247100 A1* | 8/2018 | Zhu ...................... | G06V 40/1318 |
| 2020/0265207 A1 | 8/2020 | Chu et al. | |
| 2020/0348550 A1* | 11/2020 | Wu ....................... | G06V 40/1318 |

* cited by examiner

*Primary Examiner* — Jessica M Merlin
(74) *Attorney, Agent, or Firm* — Michael Best & Friedrich LLP (57) ABSTRACT

According to one embodiment, a display device includes a first substrate, a second substrate facing the first substrate and a liquid crystal layer. The first substrate includes a base material, and a sensor which outputs a detection signal based on incident light from a liquid crystal layer side. The sensor includes a photoelectric conversion element including a first surface and a second surface, a first electrode which is in contact with the first surface, and a second electrode which is in contact with the second surface. Each of the photoelectric conversion element and the second electrode is formed in an irregular shape having a plurality of curved portions and a plurality of straight portions connecting the curved portions as seen in plan view.

13 Claims, 9 Drawing Sheets

DISPLAY DEVICE

CROSS-REFERENCE TO RELATED APPLICATIONS

This application is based upon and claims the benefit of priority from Japanese Patent Application No. 2021-107448, filed Jun. 29, 2021, the entire contents of which are incorporated herein by reference.

FIELD

Embodiments described herein relate generally to a display device.

BACKGROUND

Recently, a display device comprising a built-in sensor which detects biometric information such as a fingerprint sensor or a vein sensor has been developed. For this type of sensor, for example, an optical sensor using a photoelectric conversion element is employed.

The optical sensor detects, for example, light which is emitted from a light source such as a backlight, etc., and reflected on a target object. In terms of detection accuracy, of the light reflected on the target object, light parallel to the normal direction of the upper surface of the optical sensor should be preferably caused to enter the optical sensor.

DETAILED DESCRIPTION

In general, according to one embodiment, a display device comprises a first substrate, a second substrate facing the first substrate, and a liquid crystal layer located between the first substrate and the second substrate. The first substrate comprises a base material, and a sensor which is located between the base material and the liquid crystal layer in a display area including a pixel and outputs a detection signal based on incident light from a liquid crystal layer side. The sensor includes a photoelectric conversion element comprising a first surface facing the base material and a second surface facing the liquid crystal layer, a first electrode which is in contact with the first surface, and a second electrode which is in contact with the second surface. Each of the photoelectric conversion element and the second electrode is formed in an irregular shape having a plurality of curved portions and a plurality of straight portions connecting the curved portions as seen in plan view.

Embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the drawings show schematic illustration rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as an X-direction or a first direction. A direction parallel to the Y-axis is referred to as a Y-direction or a second direction. A direction parallel to the Z-axis is referred to as a Z-direction or a third direction. The plane defined by the X-axis and the Y-axis is referred to as an X-Y plane. The plane defined by the X-axis and the Z-axis is referred to as an X-Z plane. When the X-Y plane is viewed, the appearance is defined as a plan view.

First Embodiment

Figure 1:
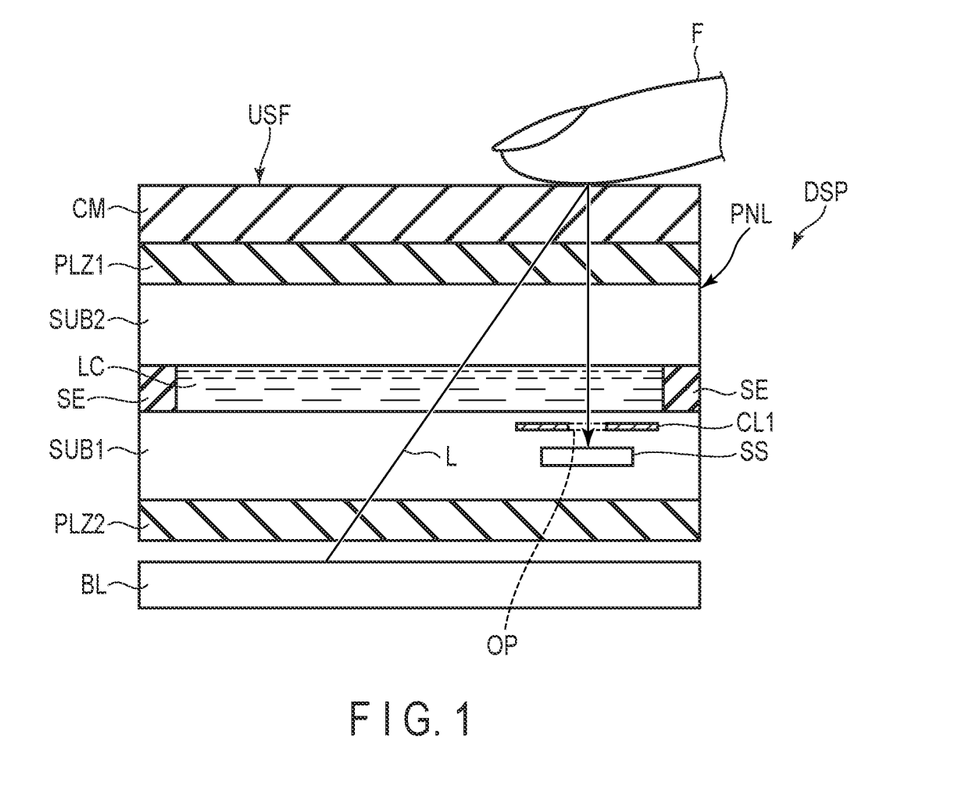
FIG. 1 schematically shows a display device according to a first embodiment.

FIG. 1 schematically shows a display device DSP according to a first embodiment. The display device DSP comprises a display panel PNL, a cover member CM, a first polarizer PLZ1, a second polarizer PLZ2 and an illumination device BL.

The display panel PNL is a liquid crystal display panel, and comprises a first substrate SUB1, a second substrate SUB2 facing the first substrate SUB1, a sealing material SE and a liquid crystal layer LC. The liquid crystal layer LC is enclosed between the first substrate SUB1 and the second substrate SUB2 by the sealing material SE. The display panel PNL of the present embodiment is a transmissive display panel which displays an image by selectively transmitting light from the back side of the first substrate SUB1 to the upper side of the second substrate SUB2.

The first substrate SUB1 comprises a sensor SS and a collimating layer CL1. The sensor SS is located between the collimating layer CL1 and, of the main surfaces of the first substrate SUB1, the main surface facing the second polarizer PLZ2. The collimating layer CL1 comprises an opening OP overlapping the sensor SS. As details are explained later, in the present embodiment, the collimating layer CL1 is formed of a metal material and has a light-shielding property. For this reason, the collimating layer CL1 may be referred to as a metal layer or a light-shielding layer.

Although not shown in FIG. 1, this type of collimating layer may be further provided in the second substrate SUB2.

The first substrate SUB1 is attached to the second substrate SUB2 by the sealing material SE. A predetermined cell gap is defined by a spacer (not shown) between the first substrate SUB1 and the second substrate SUB2. The cell gap is filled with the liquid crystal layer LC.

The cover member CM is provided on the display panel PNL. For example, a glass substrate or a resinous substrate may be used for the cover member CM. The cover member CM comprises an upper surface USF which an object to be detected by the sensor SS contacts. In the present embodiment, it is assumed that the upper surface USF of the cover member CM is parallel to the upper surface of the sensor SS. In the example of FIG. 1, a finger F which is an example of the target object is in contact with the upper surface USF. The first polarizer PLZ1 is provided between the display panel PNL and the cover member CM.

The illumination device BL is provided under the display panel PNL, and emits light L to the first substrate SUB1. The illumination device BL is, for example, a side-edge backlight device, and comprises a plate-like light guide and a plurality of light sources which emit light to a side surface of the light guide. The second polarizer PLZ2 is provided between the display panel PNL and the illumination device BL.

Of light L, light reflected on the finger F enters the sensor SS through the opening OP formed in the collimating layer CL1. In other words, light reflected on the finger F passes through the cover member CM, the first polarizer PLZ1, the second substrate SUB2, the liquid crystal layer LC and further the portion located in the higher layers than the sensor SS in the first substrate SUB1, and then enters the sensor SS.

The sensor SS outputs a detection signal based on incident light. As explained later, the display panel PNL comprises a plurality of sensors SS. Based on detection signals output by theses sensors SS, the display panel PNL is configured to detect the asperities of the finger F (for example, fingerprints).

To obtain more accurate detection signals, the sensor SS should preferably detect incident light parallel to the normal direction of the upper surface USF. The collimating layer CL1 functions as a collimator for collimating light which enters the sensor SS. In other words, light tilted relative to the normal direction of the upper surface USF (in other words, light tilted relative to the normal direction of the upper surface of the sensor SS) is shut off by the collimating layer CL1.

As described above, as the sensor SS is mounted on the display device DSP, a function as a fingerprint sensor can be added to the display device DSP. In addition to the detection of fingerprints, or instead of the detection of fingerprints, the sensor SS may be used to detect biometric information based on light reflected inside the finger F. The biometric information is, for example, a blood vessel image of a vein, etc., a pulse or a pulse wave.

Figure 2:
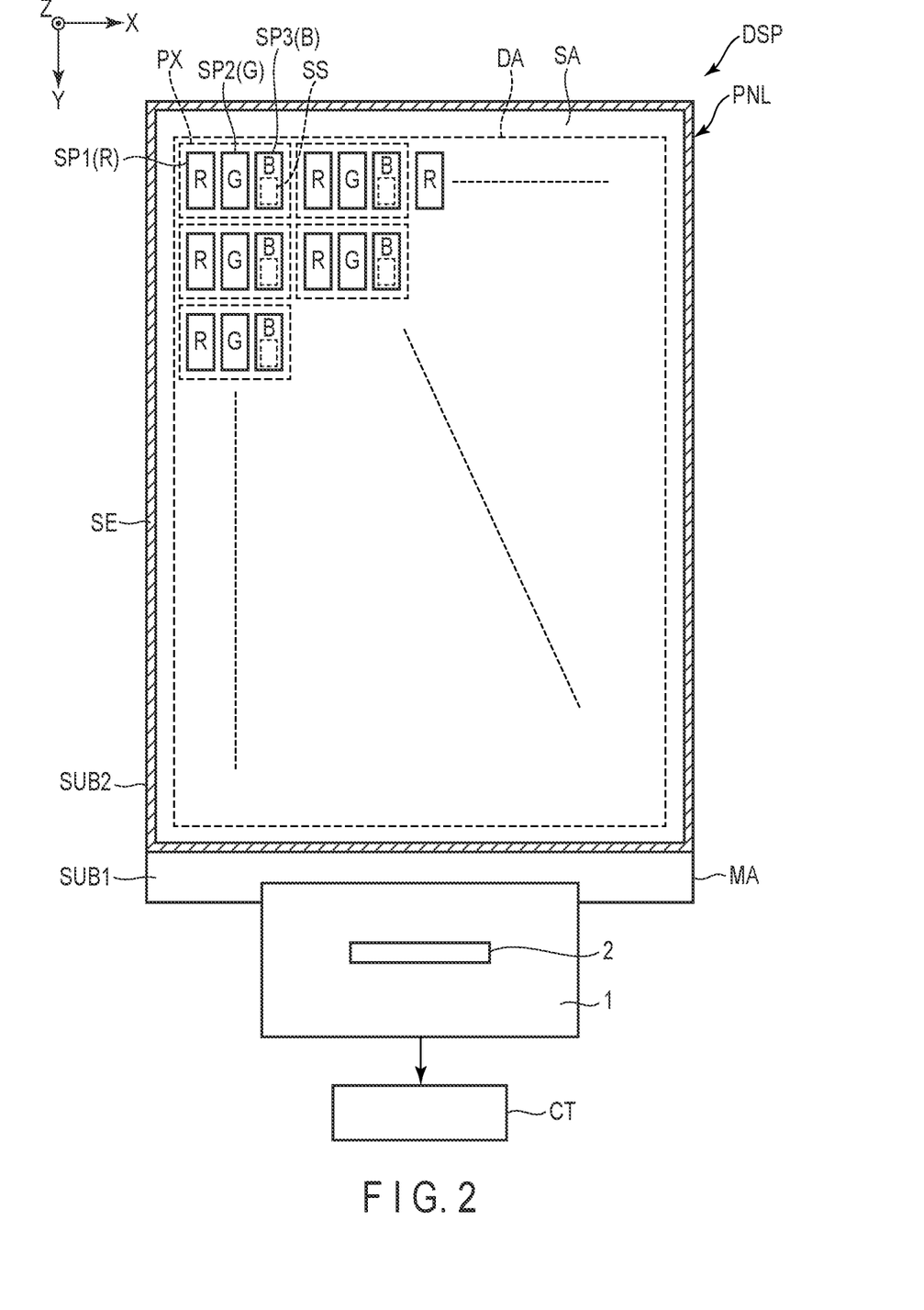
FIG. 2 is a plan view schematically showing the display device according to the embodiment.

FIG. 2 is a plan view schematically showing the display device DSP according to the embodiment. The display device DSP comprises the display panel PNL described above, and a wiring board 1 mounted on the display panel PNL. The display panel PNL comprises a display area DA which displays an image, and a surrounding area SA which surrounds the display area DA. The surrounding area SA may be referred to as a non-display area.

The first substrate SUB1 comprises a mounting area MA which does not overlap the second substrate SUB2. The sealing material SE is located in the surrounding area SA. In FIG. 2, the area in which the sealing material SE is provided is shown by hatch lines. The display area DA is located inside the sealing material SE. The display panel PNL comprises a plurality of pixels PX arrayed in matrix in a first direction X and a second direction Y in the display area DA.

Each pixel PX includes a subpixel SP1 which emits red (R) light, a subpixel SP2 which emits green (G) light and a subpixel SP3 which emits blue (B) light. Each pixel PX may include a subpixel which emits light other than red light, green light and blue light.

In the example of FIG. 2, a sensor SS is provided for each pixel PX. More specifically, a sensor SS is provided for the subpixel SP3 which emits blue light in each pixel PX. In the entire display area DA, the sensors SS are arrayed in matrix in the first direction X and the second direction Y.

The sensors SS may not necessarily be provided for all of the pixels PX. For example, one sensor SS may be provided for a plurality of pixels PX. The sensors SS may be provided for the pixels PX of a part of the display area DA, and may not be provided for the pixels PX of the other part of the display area DA.

The wiring board 1 is, for example, a flexible printed circuit board, and is connected to a terminal portion provided in the mounting area MA. The wiring board 1 comprises a driver 2 which drives the display panel PNL. The driver 2 may be mounted in another location such as the mounting area MA. For example, the driver 2 includes an IC which controls the display operation by each pixel PX, and an IC which controls the detection operation by the sensors SS. These ICs may be mounted in other locations. A detection signal output by each sensor SS is output to a controller CT via the wiring board 1 and the driver 2. The controller CT performs an operation process for detecting a fingerprint, etc., based on a detection signal from the sensors SS.

Figure 3:
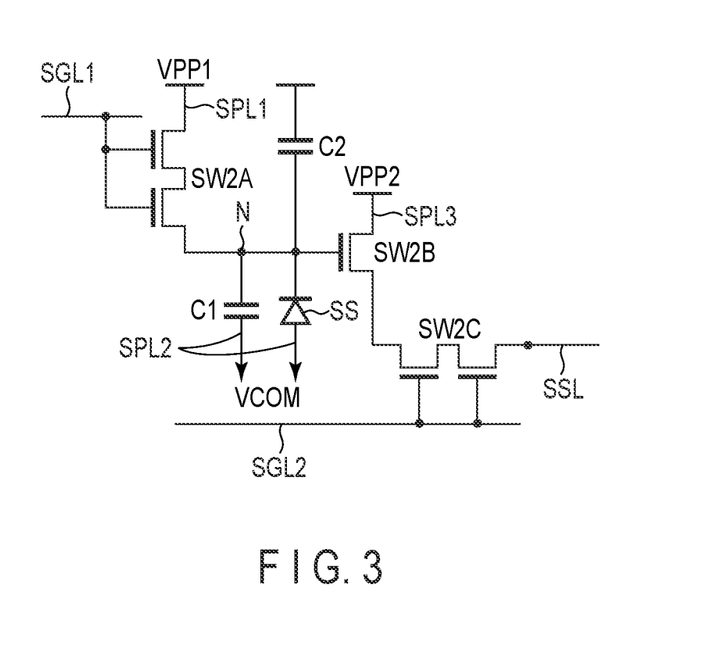
FIG. 3 is an equivalent circuit diagram showing a sensor and a sensor circuit for the sensor according to the embodiment.

FIG. 3 is an equivalent circuit diagram showing the sensor SS and a sensor circuit for the sensor SS according to the embodiment.

As shown in FIG. 3, a first sensor scanning line SGL1, a second sensor scanning line SGL2, a first sensor power supply line SPL1, a second sensor power supply line SPL2, a third sensor power supply line SPL3, a sensor signal line SSL, a switching element SW2A, a switching element SW2B, a switching element SW2C, a capacitor C1 and a capacitor C2 are provided in the sensor circuit.

Hereinafter, the first sensor scanning line SGL1 is referred to as a first scanning line SGL1. The second sensor scanning line SGL2 is referred to as a second scanning line SGL2. The first sensor power supply line SPL1 is referred to as a first power supply line SPL1. The second sensor power supply line SPL2 is referred to as a second power supply line SPL2. The third sensor power supply line SPL3 is referred to as a third power supply line SPL3.

Although FIG. 3 shows a case where each of the switching elements SW2A, SW2B and SW2C is formed by an n-type thin-film transistor (TFT), each of the switching elements SW2A, SW2B and SW2C may be formed by a p-type TFT.

Regarding the sensor SS, one electrode is connected to the second power supply line SPL2, and the other electrode is connected to a node N. The node N is connected to the drain electrode of the switching element SW2A and the gate electrode of the switching element SW2B. Second voltage VCOM is applied to one electrode of the sensor SS through the second power supply line SPL2. The second voltage VCOM may be referred to as reference voltage. When light enters the sensor SS, current based on the amount of incident light is supplied to the sensor SS. Thus, the capacitance held in the capacitor C1 is changed. The capacitance held in the capacitor C2 is parasitic capacitance added to the capacitance held in the capacitor C1.

Regarding the switching element SW2A, the gate electrode is connected to the first scanning line SGL1, and the source electrode is connected to the first power supply line SPL1, and the drain electrode is connected to the node N. When the switching element SW2A is turned on based on a scanning signal supplied from the first scanning line SGL1, the potential of the node N is reset to the potential of first voltage VPP1 applied through the first power supply line SPL1. The second voltage VCOM described above indicates a value less than the first voltage VPP1, and the sensor SS is driven in a reverse-bias manner.

Regarding the switching element SW2B, the gate electrode is connected to the node N, and the source electrode is connected to the third power supply line SPL3, and the drain electrode is connected to the source electrode of the switching element SW2C. When the switching element SW2B is turned on, current based on the capacitance held in the capacitor C1 is increased, and is supplied to the switching element SW2C.

Regarding the switching element SW2C, the gate electrode is connected to the second scanning line SGL2, and the source electrode is connected to the drain electrode of the switching element SW2B, and the drain electrode is connected to the sensor signal line SSL. When the switching element SW2C is turned on based on a scanning signal supplied from the second scanning line SGL2, an electric signal (detection signal) based on current from the switching element SW2B is output to the sensor signal line SSL.

Although FIG. 3 shows a case where the switching elements SW2A and SW2C have a double-gate structure, the switching elements SW2A and SW2C may have a single-gate structure or a multi-gate structure.

This specification more specifically explains a structure which can be applied to the first substrate SUB1 with reference to FIG. 4 to FIG. 7. It should be noted that FIG. 4 to FIG. 7 schematically show the structure of the first substrate SUB1 by the cross-sectional view and plan views. The locational relationships or shapes of the elements may differ from figure to figure.

Figure 4:
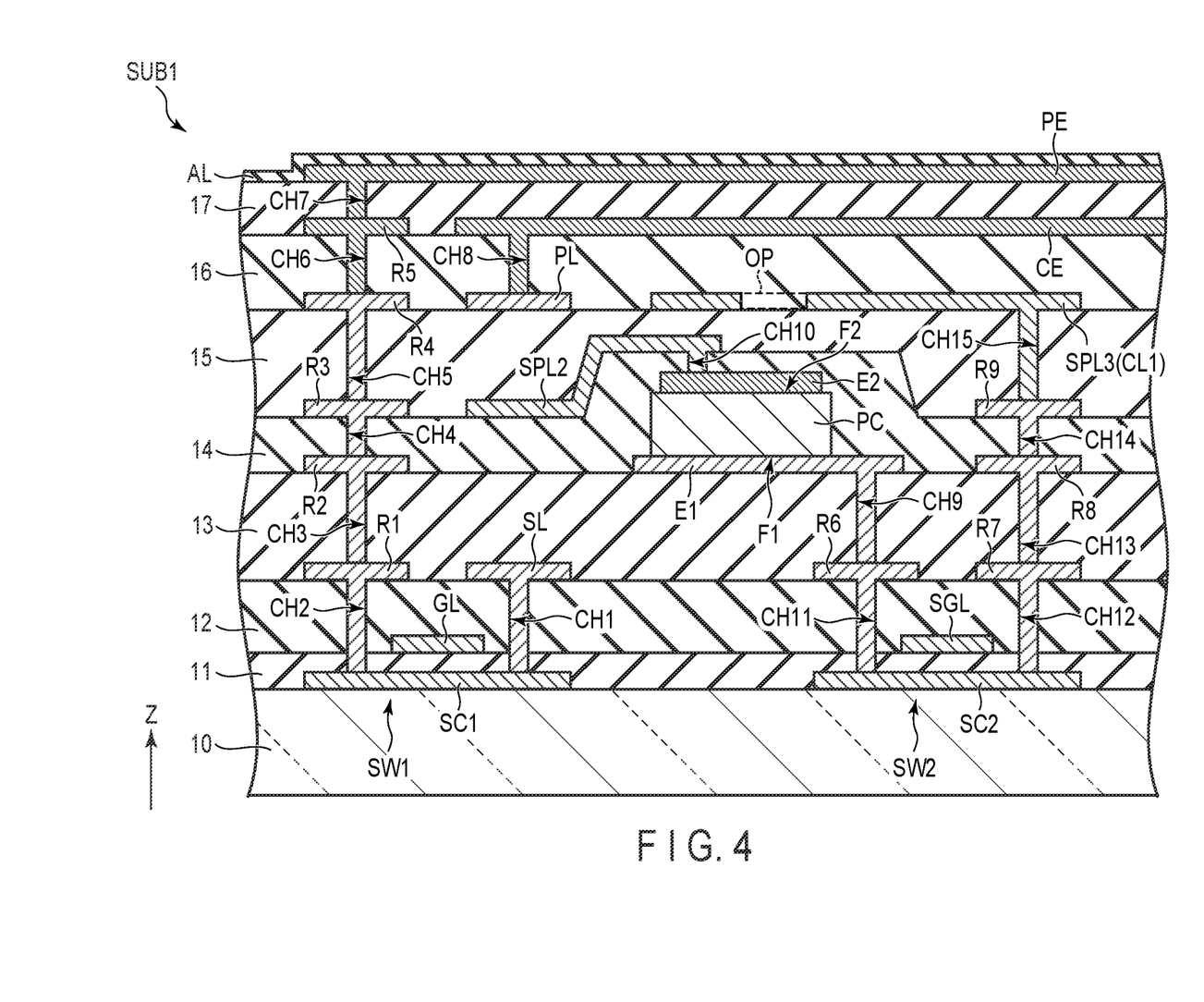
FIG. 4 is a schematic cross-sectional view showing an example of a structure which can be applied to a first substrate according to the embodiment.

FIG. 4 is a schematic cross-sectional view showing an example of a structure which can be applied to the first substrate SUB1. The first substrate SUB1 comprises a transparent first base material 10, insulating layers 11, 12, 13, 14, 15, 16 and 17 and an alignment film AL.

The first base material 10 is, for example, a glass substrate or a resinous substrate. The insulating layers 11, 12, 14 and 17 are formed of an inorganic material. The insulating layers 13, 15 and 16 are formed of an organic material. The insulating layers 11, 12, 13, 14, 15, 16 and 17 and the alignment film AL are stacked in this order in a third direction Z above the first base material 10.

The first substrate SUB1 comprises, as elements related to image display, a signal line SL, a scanning line GL, a switching element SW1, a pixel electrode PE, a common electrode CE, relay electrodes R1, R2, R3, R4 and R5 and a power supply line PL. The pixel electrode PE and the switching element SW1 are provided for each of the subpixels SP1, SP2 and SP3. For example, the common electrode CE is provided over a plurality of subpixels SP1, SP2 and SP3.

The switching element SW1 includes a semiconductor layer SC1. The semiconductor layer SC1 is provided between the first base material 10 and the insulating layer 11. The scanning line GL is provided between the insulating layers 11 and 12 and faces the semiconductor layer SC1. The scanning line GL may be provided in another layer instead of between the insulating layers 11 and 12. The signal line SL is provided between the insulating layers 12 and 13, and is in contact with the semiconductor layer SC1 through a contact hole CH1 which penetrates the insulating layers 11 and 12.

The relay electrode R1 is provided between the insulating layers 12 and 13, in other words, in the same layer as the signal line SL, and is in contact with the semiconductor layer SC1 through a contact hole CH2 which penetrates the insulating layers 11 and 12. The relay electrode R2 is provided between the insulating layers 13 and 14, and is in contact with the relay electrode R1 through a contact hole CH3 which penetrates the insulating layer 13. The relay electrode R3 is provided between the insulating layers 14 and 15, and is in contact with the relay electrode R2 through a contact hole CH4 which penetrates the insulating layer 14. The relay electrode R4 is provided between the insulating layers 15 and 16, and is in contact with the relay electrode R3 through a contact hole CH5 which penetrates the insulating layer 15. The relay electrode R5 is provided between the insulating layers 16 and 17, and is in contact with the relay electrode R4 through a contact hole CH6 which penetrates the insulating layer 16.

The pixel electrode PE is provided between the insulating layer 17 and the alignment film AL, and is in contact with the relay electrode R5 through a contact hole CH7 which penetrates the insulating layer 17. The power supply line PL is provided between the insulating layers 15 and 16, in other words, in the same layer as the relay electrode R4. The common electrode CE is provided between the insulating layers 16 and 17, in other words, in the same layer as the relay electrode R5, and is in contact with the power supply line PL through a contact hole CH8 which penetrates the insulating layer 16.

Common voltage is applied to the power supply line PL. This common voltage is applied to the common electrode CE. A video signal is supplied to the signal line SL. A scanning signal is supplied to the scanning line GL. When a scanning signal is supplied to the scanning line GL, the video signal of the signal line SL is supplied to the pixel electrode PE via the semiconductor layer SC1 and the relay electrodes R1, R2, R3, R4 and R5. At this time, an electric field is caused between the pixel electrode PE and the common electrode CE by the potential difference between common voltage and the video signal. This electric field acts on the liquid crystal layer LC.

The first substrate SUB1 comprises, as elements related to the sensor SS, a switching element SW2, a sensor scanning line SGL, relay electrodes R6, R7, R8 and R9, a second power supply line SPL2 and a third power supply line SPL3. The sensor SS comprises a first electrode (bottom electrode) E1, a second electrode (top electrode) E2 and a photoelectric conversion element PC.

In FIG. 4, for the sake of convenience, the elements related to the switching elements SW2A, SW2B and SW2C regarding the sensor SS are denoted by the switching element SW2. In addition, in FIG. 4, the element which functions as the gate electrode of the switching element SW2 described above is denoted by the sensor scanning line SGL. In FIG. 4, the element which functions as the source electrode of the switching element SW2 described above is denoted by the relay electrode R7. In FIG. 4, the element which functions as the drain electrode of the switching element SW2 described above is denoted by the relay electrode R6. FIG. 4 does not show all of the elements related to the sensor SS, and merely shows some of them.

The photoelectric conversion element PC comprises a first surface F1 facing the first base material 10, and a second surface F2 facing the liquid crystal layer LC. The second surface F2 of the photoelectric conversion element PC is equivalent to the upper surface of the sensor SS. The photoelectric conversion element PC is located between the insulating layers 13 and 14. The first electrode E1 is provided between the photoelectric conversion element PC and the insulating layer 13, and is in contact with the first surface F1. The outer circumferential portion of the first electrode E1 protrudes from the photoelectric conversion element PC, and is covered with the insulating layer 14. The first electrode E1 is in contact with the relay electrode R6 through a contact hole CH9 which penetrates the insulating layer 13 under the photoelectric conversion element PC. The second electrode E2 is provided between the photoelectric conversion element PC and the insulating layer 14, and is in contact with the second surface F2. The second electrode E2 is in contact with the second power supply line SPL2 through a contact hole CH10 which penetrates the insulating layer 14 above the photoelectric conversion element PC.

The second power supply line SPL2 is provided between the insulating layers 14 and 15, and is in contact with the second electrode E2 through the contact hole CH10 which penetrates the insulating layer 14. The second voltage VCOM is applied to the second power supply line SPL2. The second voltage VCOM is applied to the second electrode E2 through the second power supply line SPL2.

The switching element SW2 includes a semiconductor layer SC2. The semiconductor layer SC2 is provided between the first base material 10 and the insulating layer 11. The sensor scanning line SGL is provided between the insulating layers 11 and 12 and faces the semiconductor layer SC2. The sensor scanning line SGL may be provided in another layer instead of between the insulating layers 11 and 12.

The relay electrode R6 is provided between the insulating layers 12 and 13, and is in contact with the semiconductor layer SC2 through a contact hole CH11 which penetrates the insulating layers 11 and 12. The relay electrode R7 is provided between the insulating layers 12 and 13, in other words, in the same layer as the relay electrode R6, and is in contact with the semiconductor layer SC2 through a contact hole CH12 which penetrates the insulating layers 11 and 12. The relay electrode R8 is provided between the insulating layers 13 and 14, in other words, in the same layer as the first electrode E1, and is in contact with the relay electrode R7 through a contact hole CH13 which penetrates the insulating layer 13. The relay electrode R9 is provided between the insulating layers 14 and 15, in other words, in the same layer as the second power supply line SPL2, and is in contact with the relay electrode R8 through a contact hole CH14 which penetrates the insulating layer 14.

The third power supply line SPL3 is provided between the insulating layers 15 and 16, in other words, in the same layer as the power supply line PL, and is in contact with the relay electrode R9 through a contact hole CH15 which penetrates the insulating layer 15. Third voltage VPP2 is applied to the third power supply line SPL3. The third power supply line SPL3 functions as the collimating layer CL1 described above in addition to the function of applying the third voltage VPP2. In other words, a part of the third power supply line SPL3 is the above collimating layer CL1, and the third power supply line SPL3 comprises an opening OP in a location overlapping the second surface F2 of the photoelectric conversion element PC.

The signal line SL and the relay electrodes R1, R6 and R7 are formed of the same metal material. The first electrode E1 and the relay electrodes R2 and R8 are formed of the same metal material. The second power supply line SPL2 and the relay electrodes R3 and R9 are formed of the same metal material. The power supply line PL, the third power supply line SPL3 and the relay electrode R4 are formed of the same metal material. The second electrode E2, the pixel electrode PE, the common electrode CE and the relay electrode R5 are formed of a transparent conductive material such as indium tin oxide (ITO).

The first electrode E1 formed of a metal material also functions as a light-shielding layer, and prevents light emitted from the lower side from entering the photoelectric conversion element PC. The photoelectric conversion element PC is, for example, a photodiode, and outputs an electric signal (detection signal) based on incident light. More specifically, for the photoelectric conversion element PC, a positive intrinsic negative (PIN) photodiode may be employed. This type of photodiode comprises a p-type semiconductor layer, an i-type semiconductor layer and an n-type semiconductor layer. The p-type semiconductor layer is located on the second electrode E2 side. The n-type semiconductor layer is located on the first electrode E1 side. The i-type semiconductor layer is located between the p-type semiconductor layer and the n-type semiconductor layer.

The p-type semiconductor layer, the i-type semiconductor layer and the n-type semiconductor layer are formed of, for example, amorphous silicon (a-Si). It should be noted that the material of the semiconductor layers is not limited to this example. The amorphous silicon may be replaced by polycrystalline silicon, microcrystalline silicon, etc. The polycrystalline silicon may be replaced by amorphous silicon, microcrystalline silicon, etc.

Instead of the PIN photodiode, an organic photodiode (OPD) may be used.

A scanning signal is supplied to the sensor scanning line SGL at a time point when the detection by the sensor SS should be performed. When a scanning signal is supplied to the sensor scanning line SGL, a detection signal generated in the photoelectric conversion element PC is output to the sensor signal line SSL (not shown in FIG. 4). For example, the detection signal output to the sensor signal line SSL is output to the controller CT via the driver 2.

Figure 5:
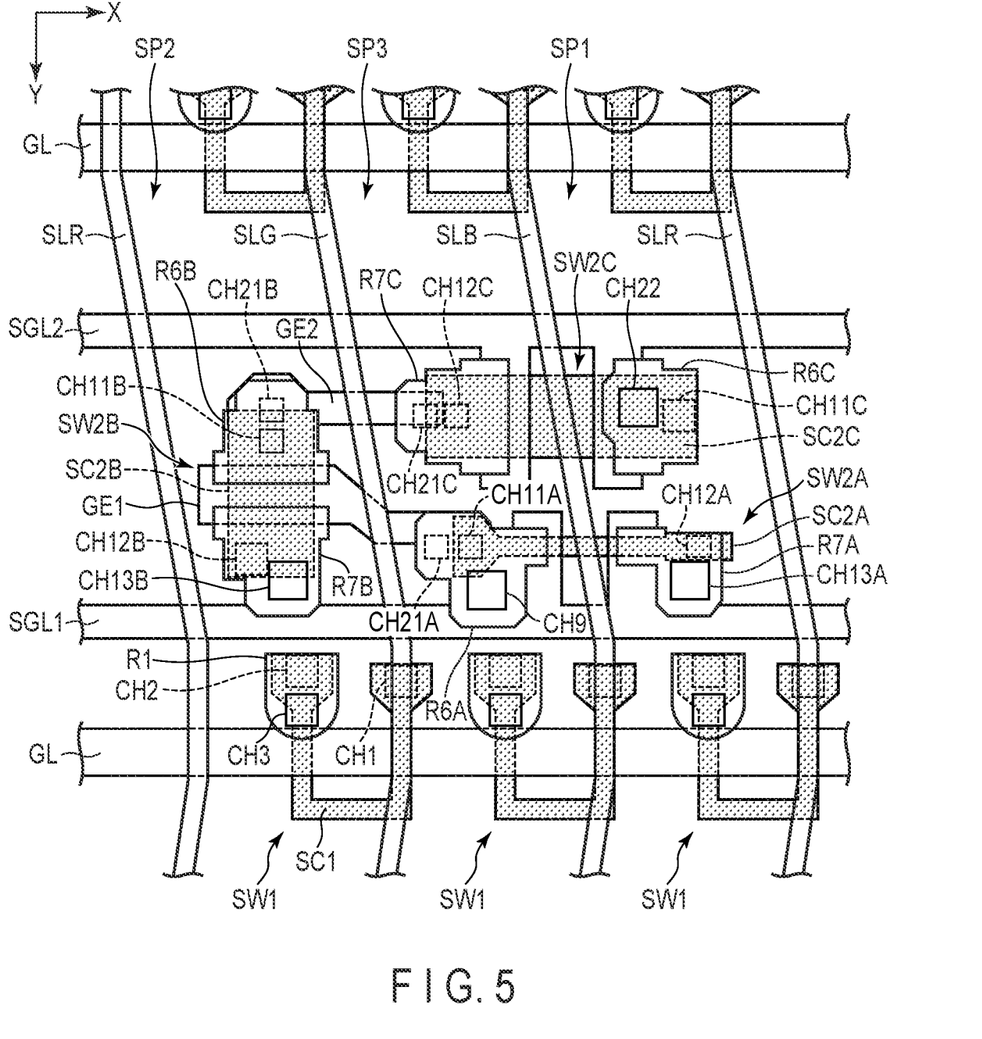
FIG. 5 is a schematic plan view showing an example of a structure which can be applied to the first substrate according to the embodiment.

FIG. 5 is a plan view schematically showing the elements which can be applied to the first substrate SUB1 and are provided in the insulating layers 11, 12 and 13 shown in FIG. 4. In FIG. 5, the contact holes provided for contact with the elements of the lower layers than the signal line SL and the relay electrodes R1, R6 and R7 are shown by broken lines, and the contact holes provided for contact with the elements of the higher layers than the signal line SL and the relay electrodes R1, R6 and R7 are shown by solid lines.

Figure 6:
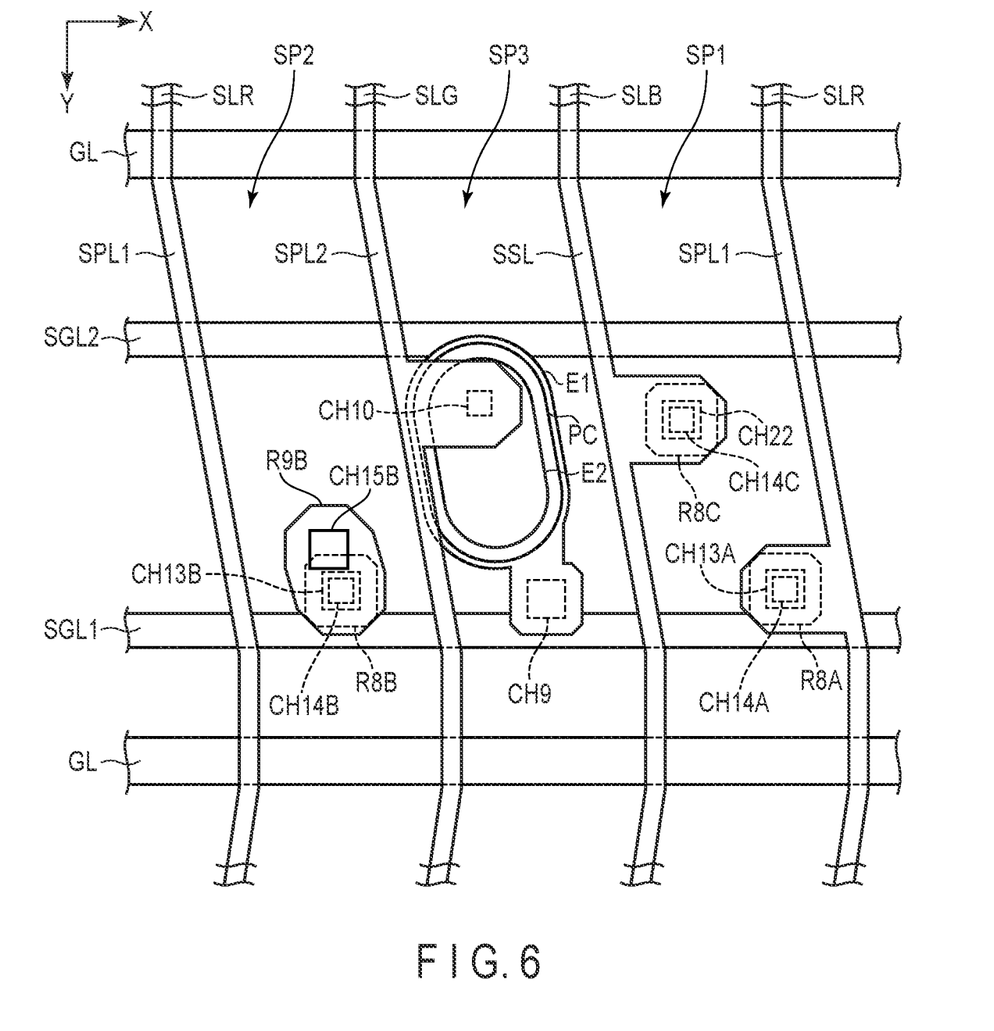
FIG. 6 is a schematic plan view showing an example of a structure which can be applied to the first substrate according to the embodiment.
Figure 7:
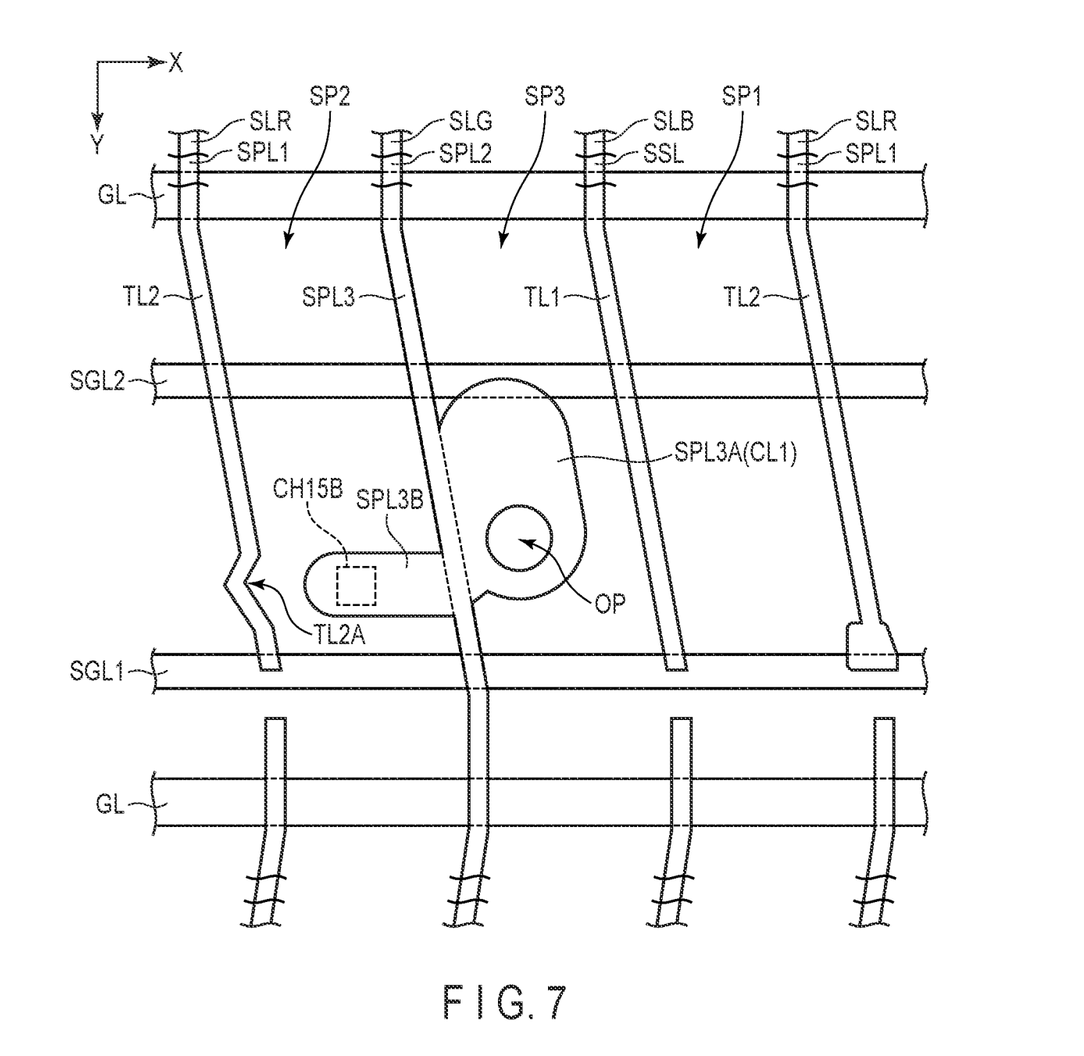
FIG. 7 is a schematic plan view showing an example of a structure which can be applied to the first substrate according to the embodiment.

In FIG. 5 to FIG. 7, the letter "A" is added to the end of the reference number of each element related to the switching element SW2A. The letter "B" is added to the end of the reference number of each element related to the switching element SW2B. The letter "C" is added to the end of the reference number of each element related to the switching element SW2C.

The scanning line GL, the first scanning line SGL1 and the second scanning line SGL2 extend in the first direction X, and are arranged in the second direction Y. The first scanning line SGL1 and the second scanning line SGL2 are arranged so as to be adjacent to each other in the second direction Y. The first scanning line SGL1 and the second scanning line SGL2 are provided between two adjacent scanning lines GL.

A signal line SLR corresponding to a red subpixel SP1, a signal line SLG corresponding to a green subpixel SP2 and a signal line SLB corresponding to a blue subpixel SP3 extend in the second direction Y while bending, and are arranged in the first direction X.

Each of the subpixels SP1, SP2 and SP3 is provided in the area surrounded by two scanning lines GL arranged so as to be adjacent to each other in the second direction Y and two signal lines SL arranged so as to be adjacent to each other in the first direction X. Each of the subpixels SP1, SP2 and SP3 comprises an opening portion surrounded by the second scanning line SGL2, the first scanning line SGL1 and two adjacent signal lines SL.

The first scanning line SGL1 comprises a branch portion (convex portion) extending in the second direction Y. This branch portion functions as the gate electrode of the switching element SW2A. A semiconductor layer SC2A is provided in an area overlapping the gate electrode of the switching element SW2A as seen in plan view.

The semiconductor layer SC2A is provided over the opening portion of the subpixel SP3 and the opening portion of the subpixel SP1. A part of this portion overlaps the signal line SLB corresponding to the subpixel SP3. An island-like relay electrode R7A which functions as the source electrode of the switching element SW2A is provided in a location overlapping the semiconductor layer SC2A in the opening portion of the subpixel SP1. The relay electrode R7A is in contact with the semiconductor layer SC2A through a contact hole CH12A. The relay electrode R7A is in contact with the relay electrodes provided in the higher layers than the relay electrode R7A through a contact hole CH13A. An island-like relay electrode R6A which functions as the drain electrode of the switching element SW2A is provided in a location overlapping the semiconductor layer SC2A in the opening portion of the subpixel SP3. The relay electrode R6A is in contact with the semiconductor layer SC2A through a contact hole CH11A.

The relay electrode R6A is in contact with a first gate electrode GE1 which functions as the gate electrode of the switching element SW2B through a contact hole CH21A. The contact hole CH21 is a through-hole which penetrates the insulating layer 12. By the contact hole CH21, the elements located in the same layer as the relay electrode R6 are brought into contact with the elements located in the same layer as the first scanning line SGL1 and the second scanning line SGL2. The relay electrode R6A is in contact with the first electrode E1 provided in a higher layer than the relay electrode R6A through the contact hole CH9.

The first gate electrode GE1 is provided over the opening portion of the subpixel SP3 and the opening portion of the subpixel SP2. A part of this portion overlaps the signal line SLG corresponding to the subpixel SP2. A semiconductor layer SC2B is provided in an area overlapping the first gate electrode GE1 in the opening portion of the subpixel SP2 as seen in plan view.

An island-like relay electrode R7B which functions as the source electrode of the switching element SW2B is provided in a location overlapping the semiconductor layer SC2B. The relay electrode R7B is in contact with the semiconductor layer SC2B through a contact hole CH12B. The relay electrode R7B is in contact with the relay electrodes provided in the higher layers than the relay electrode R7B through a contact hole CH13B. An island-like relay electrode R6B which functions as the drain electrode of the switching element SW2B is provided in a location overlapping the semiconductor layer SC2B. The relay electrode R6B is in contact with the semiconductor layer SC2B through a contact hole CH11B.

The relay electrode R6B is in contact with a second gate electrode GE2 through a contact hole CH21B. The second gate electrode GE2 is provided over the opening portion of the subpixel SP2 and the opening portion of the subpixel SP3. A part of this portion overlaps the signal line SLG corresponding to the subpixel SP2. The switching element SW2B is connected to the switching element SW2C by the second gate electrode GE2.

The second scanning line SGL2 comprises a branch portion (convex portion) extending in the second direction Y. This branch portion functions as the gate electrode of the switching element SW2C. A semiconductor layer SC2C is provided in an area overlapping the gate electrode of the switching element SW2C as seen in plan view.

The semiconductor layer SC2C is provided over the opening portion of the subpixel SP3 and the opening portion of the subpixel SP1. A part of this portion overlaps the signal line SLB corresponding to the subpixel SP3. An island-like relay electrode R7C which functions as the source electrode of the switching element SW2C is provided in a location overlapping the semiconductor layer SC2C in the opening portion of the subpixel SP3. The relay electrode R7C is in contact with the semiconductor layer SC2C through a contact hole CH12C. The relay electrode R7C is in contact with the second gate electrode GE2 through a contact hole CH21C.

An island-like relay electrode R6C which functions as the drain electrode of the switching element SW2C is provided in a location overlapping the semiconductor layer SC2C in the opening portion of the subpixel SP1. The relay electrode R6C is in contact with the semiconductor layer SC2C through a contact hole CH11C. The relay electrode R6C is in contact with the relay electrodes provided in the higher layers than the relay electrode R6C through a contact hole CH22. The contact hole CH22 is a through-hole which penetrates the insulating layer 13. By the contact hole CH22, the relay electrode R6C is brought into contact with the relay electrode R8C described later.

As an element related to image display, the switching element SW1 is provided between the first scanning line SGL1 and the scanning line GL. The semiconductor layer SC1 included in the switching element SW1 is in contact with the signal line SL of a corresponding color through the contact hole CH1. The semiconductor layer SC1 included in the switching element SW1 is in contact with the relay electrode R1 through the contact hole CH2. The relay electrode R1 is in contact with the relay electrodes provided in the higher layers than the relay electrode R1 through the contact hole CH3. In FIG. 6 and FIG. 7 explained later, for the sake of convenience, the elements provided between the first scanning line SGL1 and the scanning line GL and related to image display are omitted.

FIG. 6 is a plan view schematically showing the elements which can be applied to the first substrate SUB1 and are provided between the insulating layers 14 and 15 shown in FIG. 4. In FIG. 6, the contact holes for contact with the elements of the lower layers than the first power supply line SPL1, the second power supply line SPL2 and the sensor signal line SSL are shown by broken lines, and the contact holes for contact with the elements of the higher layers than the first power supply line SPL1, the second power supply line SPL2 and the sensor signal line SSL are shown by solid lines. In FIG. 6, in order to clarify the locational relationships, the scanning line GL, the signal line SL, the first scanning line SGL1 and the second scanning line SGL2 shown in FIG. 5 are also partly simplified.

The first power supply line SPL1, the second power supply line SPL2 and the sensor signal line SSL extend in the second direction Y while bending, and are arranged in the first direction X. The first power supply line SPL1 overlaps the signal line SLG corresponding to the green subpixel SP2 as seen in plan view. The second power supply line SPL2 overlaps the signal line SLR corresponding to the red subpixel SP1 as seen in plan view. The sensor signal line SSL overlaps the signal line SLB corresponding to the blue subpixel SP3 as seen in plan view.

The first electrode E1 of the sensor SS is provided in the opening portion of the subpixel SP3. The first electrode E1 is in contact with the relay electrode R6A of the lower layer through the contact hole CH9. The photoelectric conversion element PC is provided on the first electrode E1. The second electrode E2 of the sensor SS is provided on the photoelectric conversion element PC. The sensor SS has an ellipse shape having long axes extending parallel to the second power supply line SPL2 and short axes orthogonal to the long axes. Thus, the photoelectric conversion element PC, the first electrode E1 and the second electrode E2 are formed in an ellipse shape having long axes extending parallel to the second power supply line SPL2 and short axes orthogonal to the long axes. The second electrode E2 is in contact with the second power supply line SPL2 through the contact hole CH10.

As described above, the second power supply line SPL2 extends in the second direction Y so as to overlap the signal line SLG corresponding to the subpixel SP2 in plan view. The second power supply line SPL2 comprises a branch portion (convex portion) extending in the first direction X, and is in contact with the second electrode E2 of the sensor SS in this branch portion. By this structure, the second power supply line SPL2 is electrically connected to the sensor SS. Thus, the second voltage VCOM can be applied to the sensor SS.

An island-like relay electrode R8B is provided in the opening portion of the subpixel SP2. The relay electrode R8B is in contact with the relay electrode R7B of the lower layer through a contact hole CH13B. The relay electrode R8B is in contact with a relay electrode R9B provided in a higher layer than the relay electrode R8B through a contact hole CH14B. The relay electrode R9B is provided in the opening portion of the subpixel SP2, and overlaps the relay electrode R8B as seen in plan view, and is in contact with the relay electrode R8B of the lower layer through the contact hole CH14B. The relay electrode R9B is in contact with the third power supply line SPL3 provided in the higher layer than the relay electrode R9B through a contact hole CH15B.

An island-like relay electrode R8A is provided in the opening portion of the subpixel SP1. The relay electrode R8A is in contact with the relay electrode R7A of the lower layer through a contact hole CH13A. The relay electrode R8A is in contact with the first power supply line SPL1 provided in a higher layer than the relay electrode R8A through a contact hole CH14A. As described above, the first power supply line SPL1 extends in the second direction Y so as to overlap the signal line SLR corresponding to the subpixel SP1 in plan view. The first power supply line SPL1 comprises a branch portion (convex portion) extending in the first direction X, and is in contact with the relay electrode R8A described above in this branch portion. By this structure, the first power supply line SPL1 is electrically connected to the switching element SW2A. Thus, the first voltage VPP1 can be applied to the switching element SW2A.

An island-like relay electrode R8C is provided in the opening portion of the subpixel SP1. The relay electrode R8C is in contact with the relay electrode R6C of the lower layer through a contact hole CH22. The relay electrode R8C is in contact with the sensor signal line SSL provided in a higher layer than the relay electrode R8C through a contact hole CH14C. As described above, the sensor signal line SSL extends in the second direction Y so as to overlap the signal line SLB corresponding to the subpixel SP3 in plan view. The sensor signal line SSL comprises a branch portion (convex portion) extending in the first direction X, and is in contact with the relay electrode R8C described above in this branch portion.

FIG. 7 is a plan view schematically showing the elements which can be applied to the first substrate SUB1 and are provided between the insulating layers 15 and 16 shown in FIG. 4. In FIG. 7, in order to clarify the locational relationships, the scanning line GL, the signal line SL, the first scanning line SGL1 and the second scanning line SGL2 shown in FIG. 5 are also partly simplified.

The third power supply line SPL3 extends in the second direction Y so as to overlap the signal line SLG corresponding to the green subpixel SP2 and the second power supply line SPL2 as seen in plan view while bending. The third power supply line SPL3 comprises a first branch portion SPL3A overlapping the outer circumference of the photoelectric conversion element PC and having an ellipse shape in the opening portion of the subpixel SP3. In other words, the first branch portion SPL3A is larger than the photoelectric conversion element PC. The above first branch portion SPL3A having an ellipse shape is equivalent to the collimating layer CL1. The collimating layer CL1 having an ellipse shape comprises a circular opening OP. The collimating layer CL1 (first branch portion SPL3A) having an ellipse shape transmits light emitted from the liquid crystal layer LC side in the opening portion OP, and shuts off light emitted from the liquid crystal layer LC side in the other portion.

In addition to the above collimating layer CL1 having an ellipse shape, the third power supply line SPL3 comprises a second branch portion SPL3B (convex portion) extending in the first direction X in the opening portion of the subpixel SP2. In the second branch portion SPL3B, the third power supply line SPL3 is in contact with the relay electrode R9B provided in the opening portion of the subpixel SP2 through the contact hole CH15B. By this structure, the third power supply line SPL3 is electrically connected to the switching element SW2B. Thus, the third voltage VPP2 can be applied to the switching element SW2B.

Of the third power supply line SPL3, a portion extending in the second direction Y while bending so as to overlap the signal line SLG and the second power supply line SPL2 in plan view may be referred to as a main portion as the first branch portion SPL3A and the second branch portion SPL3B described above are referred to as branch portions.

A touch detection line TL1 is provided in a location overlapping the signal line SLB and the sensor signal line SSL as seen in plan view. A touch detection line TL2 is provided in a location overlapping the signal line SLR and the first power supply line SPL1 as seen in plan view. The touch detection lines TL1 and TL2 output, to the controller CT, a touch detection signal indicating which location in the display area DA the finger F approaches or contacts. The touch detection line TL2 has a shape dented to the opposite side of the opening portion of the subpixel SP2 in a location facing the second branch portion SPL3B extending from the third power supply line SPL3 to the opening portion of the subpixel SP2. In other words, the touch detection line TL2 comprises a concave portion TL2A formed so as to be away from the second branch portion SPL3B in a location facing the second branch portion SPL3B. This structure prevents the touch detection line TL2 from contacting the second branch portion SPL3B. Thus, a short circuit can be avoided.

According to the first embodiment explained above, the display device DSP comprises the collimating layer CL1 which shuts off light tilted relative to the normal direction of the upper surface of the sensor SS. This structure enables only the light parallel to the normal direction to enter the sensor SS, thereby improving the detection accuracy of the sensor SS. In addition, according to the embodiment, the collimating layer CL1 can be formed as a part of the third power supply line SPL3 which applies the third voltage VPP2 to the sensor circuit for the sensor SS. Thus, the collimating layer can be formed in less steps than a case where the collimating layer is formed separately and individually. Moreover, since the collimating layer CL1 can be formed as a part of the third power supply line SPL3 according to the embodiment as described above, unnecessary stacking between layers can be reduced in comparison with a case where the collimating layer is separately formed. Thus, the opening ratio of the pixels PX in which the sensors SS are provided can be improved. According to the embodiment, the sensor SS is formed in an ellipse shape. Thus, for example, in comparison with a case where the sensor SS is formed in a rectangular shape, the sensor SS does not have four corners. For this reason, the opening ratio of the pixels PX can be improved.

Second Embodiment

Now, this specification explains a second embodiment. The second embodiment is different from the above first embodiment in respect that neither a photoelectric conversion element PC nor a second electrode E2 in a sensor SS has an ellipse shape. In the following descriptions, the explanation of the same portions as the first embodiment is omitted, and portions different from those of the first embodiment are mainly explained.

Figure 8:
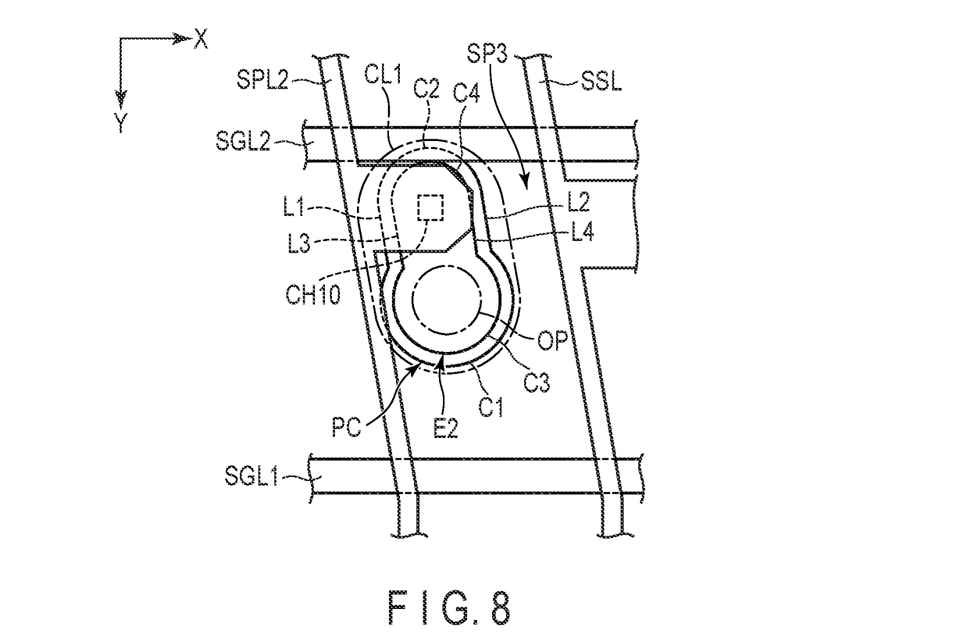
FIG. 8 is a schematic plan view showing elements related to a sensor according to a second embodiment.

FIG. 8 is a plan view showing elements related to the sensor SS according to the second embodiment. FIG. 8 shows, as elements related to the sensor SS, the photoelectric conversion element PC and the second electrode E2 constituting the sensor SS, a second power supply line SPL2 and a collimating layer CL1.

As shown in FIG. 8, the photoelectric conversion element PC is formed in an irregular shape having two curved portions C1 and C2 and two straight portions L1 and L2 connecting the two curved portions C1 and C2 in plan view. The curved portion C1 is a curve equivalent to a part of the circumference of the concentric circle of the circular opening OP of the collimating layer CL1. Thus, the curvature of the curved portion C1 is the same as that of the opening OP. The curved portion C2 is a curve smaller than the arcs of the two semicircles included in the photoelectric conversion element PC having an ellipse shape shown in FIG. 6. The curved portion C2 has a curvature different from that of the curved portion C1 and the opening OP. The straight portions L1 and L2 are straight lines extending parallel to the second power supply line SPL2.

Similarly to the photoelectric conversion element PC, as seen in plan view, the second electrode E2 provided on the photoelectric conversion element PC is formed in an irregular shape having two curved portions C3 and C4 and two straight portions L3 and L4 connecting the two curved portions C3 and C4. The curved portion C3 is equivalent to a part of the circumference of the concentric circle of the circular opening OP of the collimating layer CL1 (in other words, the curvature of the curved portion C3 is the same as that of the opening OP), and is a curve smaller than the curved portion C1 described above. Thus, the curved portion C3 is a curve located between the circumference of the opening OP of the collimating layer CL1 and the curved portion C1 of the photoelectric conversion element PC. The curved portion C4 is a curve smaller than the arcs of the two semicircles included in the second electrode E2 having an ellipse shape shown in FIG. 6. The curved portion C4 has a curvature different from that of the curved portion C3 and the opening OP. The straight portions L3 and L4 are straight lines extending parallel to the second power supply line SPL2 and the straight portions L1 and L2.

By the structure shown in FIG. 8, the photoelectric conversion element PC and the second electrode E2 may be made smaller than the structure shown in FIG. 6. By this structure, in comparison with the structure shown in FIG. 6, the area of the second electrode E2 facing the collimating layer CL1 can be reduced, and the parasitic capacitance formed between the collimating layer CL1 and the second electrode E2 can be decreased. The detection accuracy of the sensor SS can be further improved.

Figure 9:
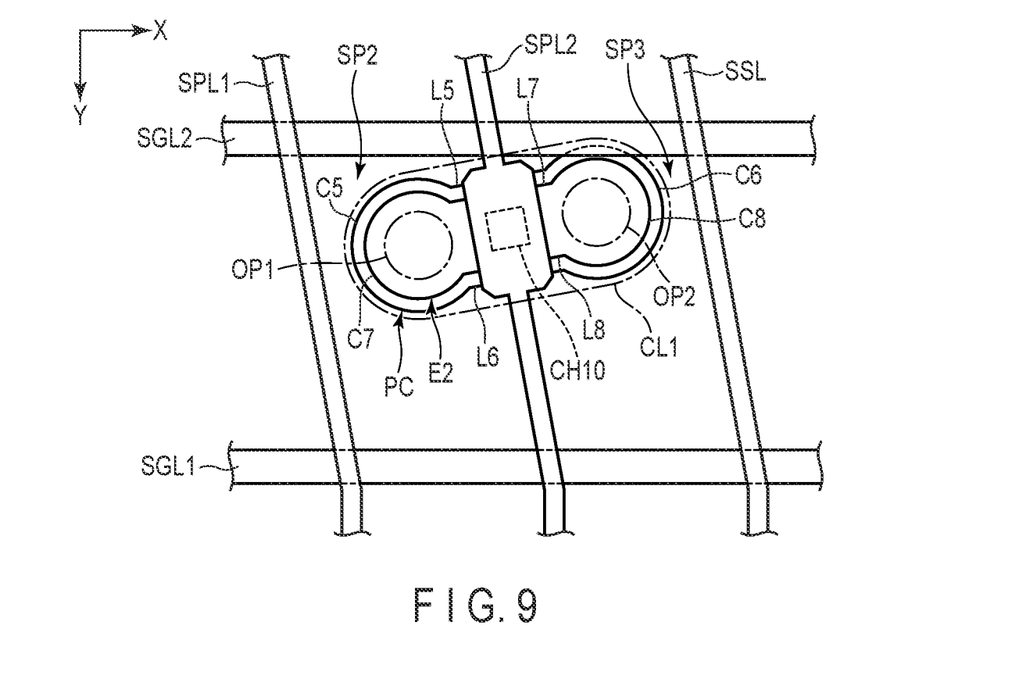
FIG. 9 is a schematic plan view showing elements related to a sensor different from FIG. 8 according to the embodiment.

FIG. 9 is a plan view showing elements related to a sensor SS different from FIG. 8 according to the second embodiment. FIG. 9 shows, as elements related to the sensor SS, a photoelectric conversion element PC and a second electrode E2 constituting the sensor SS, a second power supply line SPL2 and a collimating layer CL1.

Unlike the structures shown in FIG. 6 and FIG. 8, the sensor SS shown in FIG. 9 is provided over the opening portion of a subpixel SP2 and the opening portion of a subpixel SP3. The collimating layer CL1 comprises a circular opening OP1 overlapping the sensor SS in the opening portion of the subpixel SP2, and a circular opening OP2 overlapping the sensor SS in the opening portion of the subpixel SP3.

As shown in FIG. 9, the photoelectric conversion element PC is formed in an irregular shape having two curved portions C5 and C6 and two straight portions L5 and L6 connecting the two curved portions C5 and C6 in plan view. The curved portion C5 is a curve located in the opening portion of the subpixel SP2 and equivalent to a part of the circumference of the concentric circle of the opening OP1 on the subpixel SP2 side of the collimating layer CL1. The curved portion C6 is a curve located in the opening portion of the subpixel SP3 and equivalent to a part of the circumference of the concentric circle of the opening OP2 on the subpixel SP3 side of the collimating layer CL1. The curvatures of the curved potions C5 and C6 are the same as those of the openings OP1 and OP2. The straight portions L5 and L6 are straight lines extending in a direction orthogonal to the second power supply line SPL2.

Similarly to the photoelectric conversion element PC, as seen in plan view, the second electrode E2 provided on the photoelectric conversion element PC is formed in an irregular shape having two curved portions C7 and C8 and two straight portions L7 and L8 connecting the two curved portions C7 and C8. The curved portion C7 is a curve located in the opening portion of the subpixel SP2, equivalent to a part of the circumference of the concentric circle of the opening OP1 on the subpixel SP2 side of the collimating layer CL1, and smaller than the curved portion C5 described above. Thus, the curved portion C7 is a curve located between the circumference of the opening OP1 of the collimating layer CL1 and the curved portion C5 of the photoelectric conversion element PC. The curved portion C8 is a curve located in the opening portion of the subpixel SP3, equivalent to a part of the circumference of the concentric circle of the opening OP2 on the subpixel SP3 side of the collimating layer CL1, and smaller than the curved portion C6 described above. Thus, the curved portion C8 is a curve located between the circumference of the opening OP2 of the collimating layer CL1 and the curved portion C6 of the photoelectric conversion element PC. The curvatures of the curved potions C7 and C8 are the same as those of the openings OP1 and OP2. The straight portions L7 and L8 are straight lines extending in a direction orthogonal to the second power supply line SPL2 and parallel to the straight lines L5 and L6 described above.

The second power supply line SPL2 has a line width greater than that of the other portion in the portion intersecting with the photoelectric conversion element PC (sensor SS). This structure can prevent the disconnection of the second power supply line SPL2 in the difference caused by the thickness of the photoelectric conversion element PC. The second power supply line SPL2 is in contact with the second electrode E2 through a contact hole CH10 formed in this thick portion.

In the structure shown in FIG. 9, the sensor SS is provided over the opening portion of the subpixel SP2 and the opening portion of the subpixel SP3. Thus, in comparison with the structure shown in FIG. 6, the sensing area of the sensor SS can be extended. Further, in the structure shown in FIG. 9, two openings OP1 and OP2 are formed in the collimating layer CL1. This structure enables more light to enter the sensor SS (photoelectric conversion element PC) than the structure shown in FIG. 6. In this way, the detection accuracy of the sensor SS can be further improved.

Figure 10:
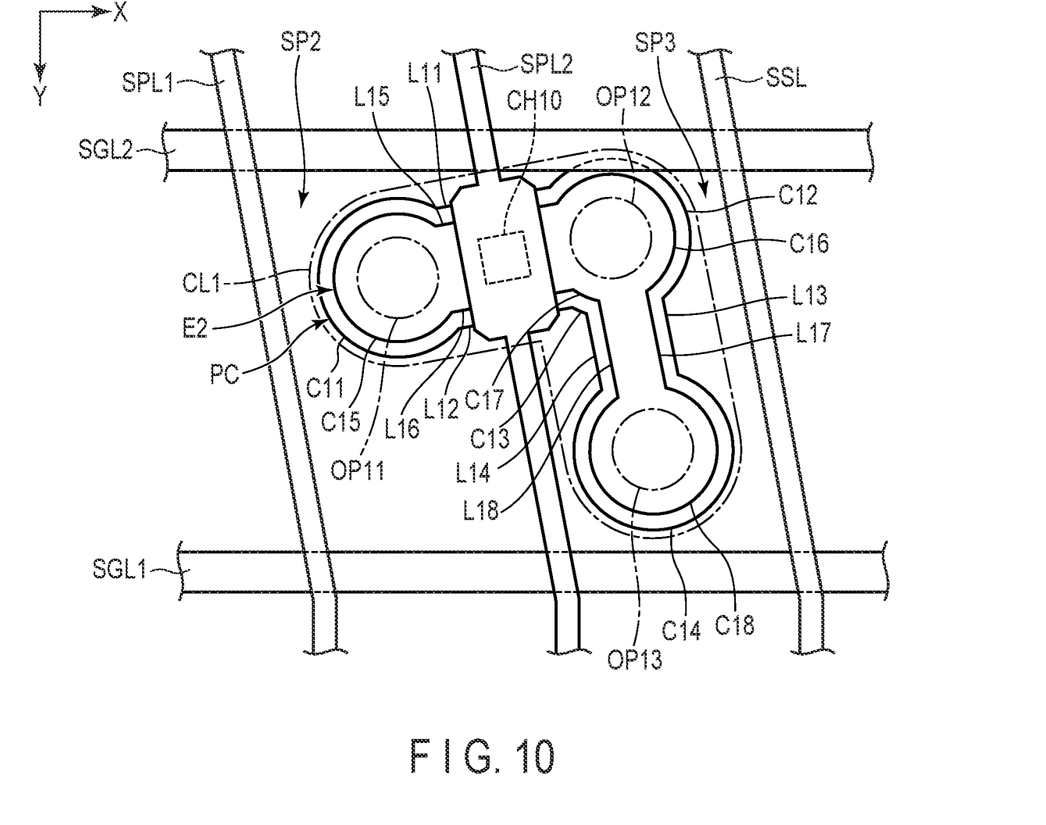
FIG. 10 is a schematic plan view showing elements related to a sensor different from FIG. 8 and FIG. 9 according to the embodiment.

FIG. 10 is a plan view showing elements related to a sensor SS different from FIG. 8 and FIG. 9 according to the second embodiment. FIG. 10 shows, as elements related to the sensor SS, a photoelectric conversion element PC and a second electrode E2 constituting the sensor SS, a second power supply line SPL2 and a collimating layer CL1.

The sensor SS shown in FIG. 10 is provided over the opening portion of a subpixel SP2 and the opening portion of a subpixel SP3. The collimating layer CL1 comprises a circular opening OP11 overlapping the sensor SS in the opening portion of the subpixel SP2, an opening OP12 overlapping the sensor SS in the opening portion of the subpixel SP3, and an opening OP13 overlapping the sensor SS in a location different from that of the opening OP12 described above in the opening portion of the subpixel SP3.

As shown in FIG. 10, in plan view, the photoelectric conversion element PC is formed in an irregular shape (L-shape) having four curved portions C11 to C14 and four straight portions L11 to L14. The curved portion C11 is a curve located in the opening portion of the subpixel SP2 and equivalent to a part of the circumference of the concentric circle of the circular opening OP11 on the subpixel SP2 side of the collimating layer CL1. The curved portions C12 and C13 are curves located in the opening portion of the subpixel SP3 and equivalent to a part of the circumference of the concentric circle of one opening OP12 on the subpixel SP3 side of the collimating layer CL1. The curved portion C14 is a curve located in the opening portion of the subpixel SP3 and equivalent to a part of the circumference of the concentric circle of the other opening OP13 on the subpixel SP3 side of the collimating layer CL1. The curvatures of the curved portions C11 to C14 are the same as those of the opening portions OP11 to OP13.

The straight portions L11 and L12 are straight lines extending in a direction orthogonal to the second power supply line SPL2. The straight portion L11 connects the curved portions C11 and C12. The straight portion L12 connects the curved portions C11 and C13. The straight portions L13 and L14 are straight lines extending parallel to the second power supply line SPL2. The straight portion L13 connects the curved portions C12 and C14. The straight portion L14 connects the curved portions C13 and C14.

Similarly, as seen in plan view, the second electrode E2 provided on the photoelectric conversion element PC is formed in an irregular shape (L-shape) having four curved portions C15 to C18 and four straight portions L15 to L18. The curved portion C15 is a curve located in the opening portion of the subpixel SP2, equivalent to a part of the circumference of the concentric circle of the opening OP11 on the subpixel SP2 side of the collimating layer CL1, and smaller than the curved portion C11 described above. Thus, the curved portion C15 is a curve located between the circumference of the opening OP11 of the collimating layer CL1 and the curved portion C11 of the photoelectric conversion element PC.

The curved portions C16 and C17 are curves located in the opening portion of the subpixel SP3, equivalent to a part of the circumference of the concentric circle of one opening OP12 on the subpixel SP3 side of the collimating layer CL1, and smaller than the curved portions C12 and C13 described above. The curved portion C16 is a curve located between the circumference of the opening OP12 of the collimating layer CL1 and the curved portion C12 of the photoelectric conversion element PC. The curved portion C17 is a curve located between the circumference of the opening OP12 of the collimating layer CL1 and the curved portion C13 of the photoelectric conversion element PC.

The curved portion C18 is a curve located in the opening portion of the subpixel SP3, equivalent to a part of the circumference of the concentric circle of the other opening OP13 on the subpixel SP3 side of the collimating layer CL1, and smaller than the curved portion C14 described above. Thus, the curved portion C18 is a curve located between the circumference of the opening OP13 of the collimating layer CL1 and the curved portion C14 of the photoelectric conversion element PC.

The curvatures of the curved portions C15 to C18 are the same as those of the openings OP11 to OP13. The straight portions L15 and L16 are straight lines extending in a direction orthogonal to the second power supply line SPL2 and parallel to the straight portions L11 and L12 described above. The straight portion L15 connects the curved portions C15 and C16. The straight portion L16 connects the curved portions C15 and C17. The straight portions L17 and L18 are straight lines parallel to the second power supply line SPL2 and the straight portions L13 and L14. The straight portion L17 connects the curved portions C16 and C18. The straight portion L18 connects the curved portions C17 and C18.

The second power supply line SPL2 has a line width greater than that of the other portion in the portion intersecting with the photoelectric conversion element PC (sensor SS). This structure can prevent the disconnection of the second power supply line SPL2 in the difference caused by the thickness of the photoelectric conversion element PC. The second power supply line SPL2 is in contact with the second electrode E2 through a contact hole CH10 formed in this thick portion.

In the structure shown in FIG. 10, the sensor SS is provided over the opening portion of the subpixel SP2 and the opening portion of the subpixel SP3. Thus, in comparison with the structure shown in FIG. 6, the sensing area of the sensor SS can be extended. Further, in the structure shown in FIG. 10, three openings OP11 to OP13 are formed in the collimating layer CL1. This structure enables more light to enter the sensor SS (photoelectric conversion element PC) than the structure shown in FIG. 6. In this way, the detection accuracy of the sensor SS can be further improved.

In the embodiment described above, the number of openings OP formed in the collimating layer CL1 is one, two or three. However, the number of openings OP is not limited to these examples. The number of openings OP may be determined based on the amount of light required by the sensor SS to detect biometric information and the opening ratio of the pixels PX.

According to the second embodiment explained above, in addition to effects similar to those of the above first embodiment, the detection accuracy of the sensor SS can be further improved.

According to at least one of the embodiments explained above, the detection accuracy of the sensor SS (optical sensor) provided in the display device DSP (liquid crystal display device) can be improved.

In this specification, it is assumed that the display device DSP is a liquid crystal display device comprising the illumination device BL. However, the display device DSP is not limited to this example. The display device DSP may be an organic electroluminescent display device comprising an organic light emitting diode (OLED) as a display element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first substrate;
a second substrate facing the first substrate; and
a liquid crystal layer located between the first substrate and the second substrate, wherein
the first substrate comprises:
a base material; and
a sensor which is located between the base material and the liquid crystal layer in a display area including a pixel, and outputs a detection signal based on incident light from a liquid crystal layer side,
wherein the sensor includes:
a photoelectric conversion element comprising a first surface facing the base material and a second surface facing the liquid crystal layer;
a first electrode which is in contact with the first surface; and
a second electrode which is in contact with the second surface, and
each of the photoelectric conversion element and the second electrode is formed in an irregular shape having a plurality of curved portions and a plurality of straight portions connecting the curved portions as seen in plan view.

2. The display device of claim 1, wherein
the first substrate further comprises a collimating layer located between the sensor and the liquid crystal layer, and
the collimating layer comprises a circular opening which transmits, of the incident light from the liquid crystal layer side, light parallel to a normal direction of an upper surface of the sensor in a location overlapping the photoelectric conversion element and the second electrode as seen in plan view.

3. The display device of claim 2, wherein
the collimating layer shuts off, of the incident light from the liquid crystal layer side, light tilted relative to the normal direction.

4. The display device of claim 2, wherein
each of the photoelectric conversion element and the second electrode comprises a first curved portion having a same curvature as the opening, a second curved portion having a curvature different from the curvature of the opening, and a plurality of straight portions connecting the first curved portion and the second curved portion.

5. The display device of claim 2, wherein
each of the photoelectric conversion element and the second electrode comprises a plurality of curved portions having same curvatures as the opening, and a plurality of straight portions connecting the curved portions.

6. The display device of claim 2, wherein
the pixel includes a first subpixel corresponding to red, a second subpixel corresponding to green, and a third subpixel corresponding to blue, and
the sensor is provided in an area in which the third subpixel is located.

7. The display device of claim 2, wherein
the pixel includes a first subpixel corresponding to red, a second subpixel corresponding to green, and a third subpixel corresponding to blue, and
the sensor is provided over an area in which the second subpixel is located and an area in which the third subpixel is located.

8. The display device of claim 7, wherein
the collimating layer comprises the opening in each of the area in which the second subpixel is located and the area in which the third subpixel is located.

9. The display device of claim 6, wherein
the collimating layer comprises the openings in the area in which the third subpixel is located.

10. The display device of claim 6, wherein
the first substrate further comprises a first line which extends between the second subpixel and the third subpixel and which is in contact with the second electrode via an opening portion as seen in plan view.

11. The display device of claim 10, wherein
the first line has a line width greater than the other portion in a portion intersecting with the photoelectric conversion element.

12. The display device of claim 10, wherein
the first substrate further comprises a second line provided so as to overlap the first line as seen in plan view and electrically connected to the sensor, and
the collimating layer is formed by diverging from the second line.

13. The display device of claim 1, wherein
the first electrode is formed of a metal material, and the second electrode is formed of a transparent conductive material.

\* \* \* \* \*